United States Patent [19]
Gaston

[11] Patent Number: 5,532,496
[45] Date of Patent: Jul. 2, 1996

[54] PROXIMITY EFFECT COMPENSATION IN SCATTERING-MASK LITHOGRAPHIC PROJECTION SYSTEMS AND APPARATUS THEREFORE

[75] Inventor: Charles A. Gaston, Lancaster, Pa.

[73] Assignee: International Business Machines Corporation, Armonk, N.Y.

[21] Appl. No.: 355,887

[22] Filed: Dec. 14, 1994

[51] Int. Cl.$^6$ ................................................ H01J 37/317
[52] U.S. Cl. ............................ 250/492.22; 378/34
[58] Field of Search ......................... 250/492.22, 492.2; 378/34; 430/296, 311, 395, 396, 494, 966, 967

[56] References Cited

U.S. PATENT DOCUMENTS

| | | | |
|---|---|---|---|
| 4,463,265 | 7/1984 | Owen et al. ................ | 250/492.22 |
| 4,743,766 | 5/1988 | Nakasuji et al. ............ | 250/492.22 |
| 4,947,413 | 8/1990 | Jewell et al. ............... | 378/34 |
| 5,079,112 | 1/1992 | Berger et al. ............... | 430/4 |
| 5,097,138 | 3/1992 | Wakabayashi et al. ...... | 250/492.22 |
| 5,130,213 | 7/1992 | Berger et al. ............... | 430/4 |

Primary Examiner—Jack I. Berman
Attorney, Agent, or Firm—Perman & Green

[57] ABSTRACT

In electron beam lithography, formation of micron and submicron size features is complicated by undesired non-uniform (pattern-density dependent) resist exposure from electrons backscattered from the underlying substrate. The disclosed technique uses a combination of a scattering mask and a scattering filter to add a leveling background exposure automatically and thus provide uniform contrast across the entire exposure pattern.

15 Claims, 3 Drawing Sheets

PROXIMITY EFFECT COMPENSATION IN SCATTERING-MASK LITHOGRAPHIC PROJECTION SYSTEMS AND APPARATUS THEREFORE

BACKGROUND OF THE INVENTION

1. Technical Field of the Invention

The present invention relates in general to lithographic exposure processes such as electron beam lithography. It relates more specifically to projection lithography systems employing a scattering mask instead of the conventional blocking masks and to exposure nonuniformities caused by energy scattering within or near the target of such lithographic processes. The invention is particularly applicable to the field of electron beam lithography for integrated circuits but is also beneficial for projection systems using other types of energy, such as X-rays or ultraviolet light, or having other purposes, such as production of integrated optics or microscopic mechanical devices.

2. Terminology

To avoid ambiguity or confusion, it is appropriate to define some of the terms used in the present application. The following definitions are made as clear as possible by limiting them to simple electron beam lithography of integrated circuits, but analogous definitions would apply to X-rays or other forms of radiation, to applications other than the patterning of integrated silicon circuits and to other generalizations. The specificity of these definitions is not intended to limit the generality of the invention.

Transparent: Passes electrons with little or no scattering.

Projection Mask: A master pattern of transparent and nontransparent areas which determines where electrons will and will not strike the target. Usually the master pattern is projected onto the target at a significantly reduced size.

Scattering Mask: A projection mask in which the nontransparent areas generally scatter the electrons somewhat (add relatively small random deviations to their original vectors) instead of absorbing or reflecting them.

Scattering-mask Lithographic Projection System: An electron beam system incorporating, in sequence: an electron source, a scattering mask, a back focal plane where electrons spreading directly from the source would be focused, and a target plane where electrons spreading directly from the scattering mask would be focused. Such a system also requires, as a minimum, one lens (generally in the vicinity of the scattering mask) to focus the source at the back focal plane, and one lens (generally in the vicinity of the back focal plane) to focus the mask at the target.

Back Focal Plane Filter: A mask of transparent and nontransparent areas, placed at a plane where the original electron source is imaged. Such a filter can be designed to pass, scatter or block electrons striking it in different places.

Target: A silicon wafer coated with a "resist" material that becomes more easily dissolved when exposed to an electron beam. Thus, after chemical processing the resist material is entirely removed from all areas of the target where the projected electron beam exposure was sufficiently intense. Because of uncontrollable variations in the chemical processing, faithful reproduction of the intended pattern is possible only when there is a significant difference between the minimum exposure in areas intended to be exposed, and the maximum exposure in areas intended to remain unexposed.

Backscattering: The scattering of incident electrons within the silicon of the target, so that they re-emerge and produce additional resist exposure a significant distance from the original impact point. The accelerating voltage of the electrons has a significant effect on the backscatter distribution profile, which may extend only a few micrometers or tens of micrometers from the impact point.

Proximity Effect: A pattern-dependent variation in general exposure levels. Electrons passing through the resist and striking the underlying silicon substrate are scattered back upward, producing additional resist exposure on their second pass. Because the backscattered electrons typically spread over an area much larger than a minimum-size pattern feature, an isolated spot may get only 5% or less additional exposure; however, accumulated backscattering from many adjacent spots may increase effective resist exposure by 80% or more.

Using those nominal percentages and assuming that direct exposure is 100 units, it can be seen that large exposed areas would receive 1130 units, small unexposed areas in the middle of such large exposed areas would receive 80 units, and small isolated exposed areas would receive 105 units of exposure. That 105-to-80 difference is not a comfortable margin for process control. The proximity effect causes dense pattern areas to be overexposed and/or sparse pattern areas to be underexposed.

DESCRIPTION OF THE PRIOR ART

Several methods have been used or proposed to compensate for the proximity effect in electron beam (E-beam) lithography. In conventional shaped-spot E-beam systems, the proximity effect is minimized by reducing the exposure levels, particularly in the interior of exposed areas, to compensate for accumulated backscattering exposure. Since the net exposure level at each spot is affected by the beam intensity at every spot in the vicinity, extensive expensive computations are required to determine the appropriate doses everywhere. Such spot-by-spot dose control is not really compatible with any type of system using projection of a broad beam through a patterned mask.

A totally different type of proximity effect correction is disclosed by Owen and Rissman in U.S. Pat. No. 4,463,265. This patent teaches a dual exposure process in which the second exposure is a negative of the first, but reduced in intensity and defocused to simulate the degree of spread produced by backscattering. Dense areas of the primary pattern are heavily exposed by backscattering, but lightly exposed by the defocused negative image. Conversely, sparse areas in the primary exposure are more heavily exposed in the second exposure. The net effect is an essentially level background exposure above which the desired exposure pattern is clearly more intense.

Advantages of the approach in U.S. Pat. No. 4,463,265 include compatibility with mask projection systems and elimination of the need for extensive proximity correction computations or dynamic control of beam intensity. Disadvantages include the need for two exposures (and two masks, in the case of mask projection systems) and the difficulty of producing an appropriately defocused negative image without affecting magnification or alignment. The patent mentions the possibility of concurrent exposure of positive and negative patterns but gives as an example only a raster scan system in which the beam is defocused and attenuated (rather than blanked) for all the negative pixels of the pattern. In practice, such changes of focus are accomplished much more slowly than blanking, so it would be faster to do two complete exposures at different constant focus and intensity settings.

Reference also is made to NakasuJi et al. U.S. Pat. No. 4,743,766 which discusses proximity effect correction; however, the main difference from 4,463,265 seems to be merely the use of a deliberately coarser negative pattern to improve thruput in shaped-spot systems.

A unique type of mask projection system is disclosed by Berger and Gibson in U.S. Pat. No. 5,079,112. This system uses a scattering mask in place of the conventional blocking mask, and subsequently blocks the scattered electrons with a back focal plane filter having only a small central aperture. Unscattered electrons from the transparent areas of the mask go through the aperture to form the desired image, while electrons scattered by the nontransparent areas of the mask strike the back focal plane filter outside the aperture and are blocked. This approach minimizes heating and distortion in the mask (because most energy is transmitted; little is absorbed), but it suffers the same proximity effect problems as any of the more conventional E-beam lithography systems. U.S. Pat. No. 5,130,213, a continuation-in-part of 5,079,112, discusses the problem of proximity effect; however, the solutions it suggests involve more complex masks, multiple exposures or modified resist processes. Thus, the known systems of compensating for the proximity effect require either massive calculations and spot-by-spot exposure control or massive calculations and creation of a complex multi-density mask, or a second (negative) exposure with an accurately defocused beam. It is very desirable to eliminate both the calculations and the defocused second exposure.

SUMMARY OF THE INVENTION

The concept of defocused negative exposure from U.S. Pat. No. 4,463,265 can be applied to the special case of the scattering-mask projection system of U.S. Pat. No. 5,079,112 to provide inherent proximity effect correction. At the back focal plane of the scattering-mask projection system, energy is available from both the transparent (positive) and scattering (negative) parts of the mask. If there were no back focal plane filter, both positive and negative images would be focused sharply on the target, giving a virtually uniform exposure everywhere on the target. A normal back focal plane filter, consisting of a small central aperture in an otherwise opaque plate, would pass the positive-image electrons while blocking the more widely scattered negative-image electrons. The essence of the present invention is a modification of that back focal plane filter to include a scattering annulus around the central aperture. This annulus passes a portion of the negative-image electrons while introducing a degree of scatter at the target similar to that produced by backscattering. This combination of unscattered positive image and scattered negative image emulates in a single step the dual-exposure proximity correction of U.S. Pat. No. 4,463,265.

The modified back focal plane filter of this invention can be manufactured by processes very similar to those used to produce the scattering mask itself. Whereas a single variable may define the degree of defocusing of a beam, construction of a scattering annulus offers many degrees of freedom. A back focal plane filter can, for example, have an open central aperture and several concentric rings of varying width and film thickness designed to produce a net scattered energy distribution resembling that produced by the unavoidable backscattering. The extreme diameter of the annulus determines the fraction of the scattered negative-image electrons allowed to reach the target. The film thickness at various points in the annulus determines the degree of scattering imparted to electrons passing through those points.

The scattering annulus of the back focal plane filter is described above as consisting of concentric circles, but can be radial sectors or virtually any other shape. An advantage of using radial sectors is that the total negative-image energy passed, and the distribution of scattering imparted, is essentially independent of variations in the degree of scattering produced by the scattering mask. Also, it is not necessary for the annulus to consist of distinct regions of constant thickness; thickness can vary continuously from one region to another.

THE DRAWINGS

DETAILED DESCRIPTION OF THE INVENTION

Figure 1:
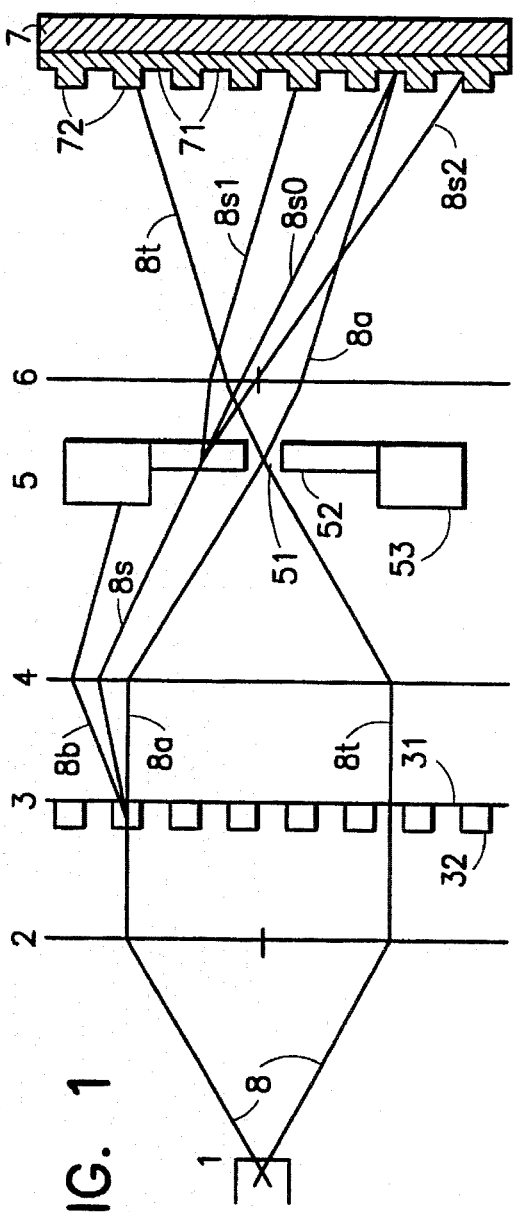
FIG. 1 is a diagrammatic illustration of an electron beam exposure system and apparatus according to the present invention, incorporating a scattering mask and a back focal plane filter with an annular scattering region.

The simplified E-beam projection system and apparatus depicted in FIG. 1 has as key physical elements an electron source 1, a condenser lens 2, a scattering mask 3, an objective lens 4, a back focal plane filter 5, a projection lens 6 and a target 7 carrying an electron-sensitive resist layer. Scattering mask 3 has transparent regions 31 and scattering regions 32. Back focal plane filter 5 has a central aperture 51, a scattering annulus 52 and a blocking region 53. Objective lens 4 images source 1 at aperture 51, while projection lens 6 images mask 3 at target 7.

FIG. 1 also depicts the flow of energy, identified as rays 8, from source 1 to target 7. Net energy at target 7 is depicted by base level regions 71 and intense level regions 72. Rays passing undisturbed through transparent regions 31 are identified as 8t, and such rays are directed by lens 4 through aperture 51 and then by lens 6 to target 7 at intense level regions 72, replicating the pattern of mask 3.

Figure 2:
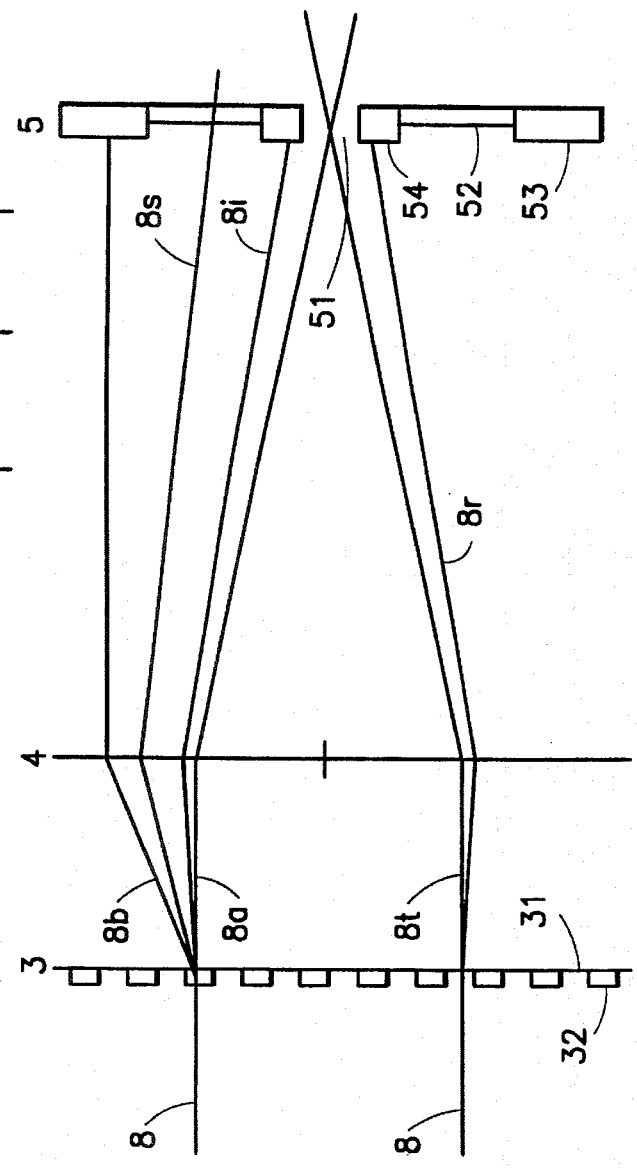
FIG. 2 is a more detailed illustration of the region from the scattering mask to the back focal plane filter showing the advantage of adding an inner blocking ring to the scattering mask.

Rays scattered by mask scattering regions 32 are identified as 8b, 8s and 8a; such rays may reach filter 5 at blocking region 53 (as does 8b), at scattering annulus 52 (as does 8s), or even at aperture 51 (as does 8a). The rays 8s striking the scattering annulus 52 may pass through with little or no deflection as identified by 8s, or may be further scattered, as identified by 8s1 and 8s2. Of course, all rays 8b are stopped by blocking region 53, and all rays 8a pass undeflected through aperture 51. FIG. 2 uses the same identification numbers as FIG. 1, but adds to back focal plane filter 5 an inner blocking region 54, between aperture 51 and scattering annulus 52. It also adds scattered rays designated as 8i and 8r which strike inner blocking region 54. Rays 8r represent the fact that some physical support is required for scattering regions 32, so that even transparent regions 31 produce some degree of scattering that may exceed the acceptance angle of aperture 51. If most of these rays can be blocked, as by inner blocking region 54, no compensation is required for their scattered energy, and higher contrast is possible. Because inner blocking region 54 also blocks rays 8*i*, there is a limit to its size. Only rays 8*s* are useful in compensating for the backscattering of desired rays 8*t*. If rays 8*s* represent an insufficient fraction of the rays from mask scattering regions 32, proximity effect compensation becomes inadequate.

Some relatively simple equations can show a necessary condition for exact proximity effect compensation of the energy striking (positive) transparent regions 31 of mask 3 let PA represent the fraction continuing through aperture 51, let PS represent the fraction continuing through scattering annulus 52 to reach target 7, and let PB represent the remaining fraction—reflected, absorbed, widely scattered or otherwise blocked from reaching target 7. These fractions are defined such that $$PA+PS+PB=1 \quad (1)$$

Similarly, of the energy striking (negative) scattering regions 32 of mask 3, let NA, NS and NB represent the fraction continuing through aperture 51, the fraction continuing through scattering annulus 52, and the fraction blocked, respectively. For these three fractions, $$NA+NS+NB=1 \quad (2)$$

Finally, let b designate the fraction of incident energy that is backscattered in target 7. Thus for an incident exposure E, net exposure including backscattering would be E+Eb. Maximum exposure Emax, should occur in a large all-positive area:

$$Emax=PA+PS+PAb+PSb \quad (3)$$

Minimum exposure, Emin, should occur in a large all-negative area:

$$Emin=NA+NS+NAb+NSb \quad (4)$$

Of the eight possible exposure components listed in equations (3) and (4), only PA and NA are sharply focused; the others cannot have sudden lateral changes. Consequently, for vanishingly small positive points in a large negative area, or vice versa, the following equations must hold if exposure levels and contrasts are to be consistent everywhere (no proximity effect):

$$Emax=PA+NS+NAb+NSb \quad (5)$$

$$Emin=NA+PS+PAb+Psb \quad (6)$$

Comparing equation (3) with (5), or (4) with (6) yields $$PS+PAb+PSb=NS+NSb+NSb \quad (7)$$

which can be manipulated to the form $$\frac{PA-NA}{NS-PS} = \frac{1+b}{b} \quad (8)$$

Equation (8) is a necessary, but not sufficient condition for compensating for proximity effect. This equation generally can be satisfied by proper sizing and placement of aperture, 51 and scattering annulus 52 in back focal plane filter 5. The other necessary condition is that the lateral distribution of components (PS+PAb+PSb) be identical to the lateral distribution of components (NS+NAb+NSb). This condition is trivially true if there is no distinction between positive and negative (Emax=Emin), but for realistic situations it may not be possible to make the two distributions match exactly. A practical approximation is achieved by tailoring the degree of scattering in scattering annulus 52 in order to make the central peak intensities match for the (PS+PAb+PSb) and (NS+NAb+NSb) distributions of equal-sized positive and negative areas. The use of multiple scattering annuli with different degrees of scattering may permit more accurate matching of the true distribution.

In addition to equalizing the exposure and contrast everywhere it is desirable to maximize contrast C, given by $$C = \frac{Emax}{Emin} = \frac{PA + PAb + PS + PSb}{NA + PAb + PS + PSb} \quad (9)$$

and to minimize exposure time by maximizing exposure Emax, given by equation (3) or (5).

It should be recognized by those skilled in the art that satisfying equation (8), matching the desired lateral distribution, maximizing contrast and maximizing exposure generally will lead to contradictory requirements such that engineering tradeoffs will be required. For example, reducing the size of central aperture 51 to improve contrast may cause increased exposure time. Similarly, increasing the degree of scattering in mask scattering regions 32 to improve contrast may increase chromatic aberration and otherwise contribute to poorer lateral distribution.

Figure 3:
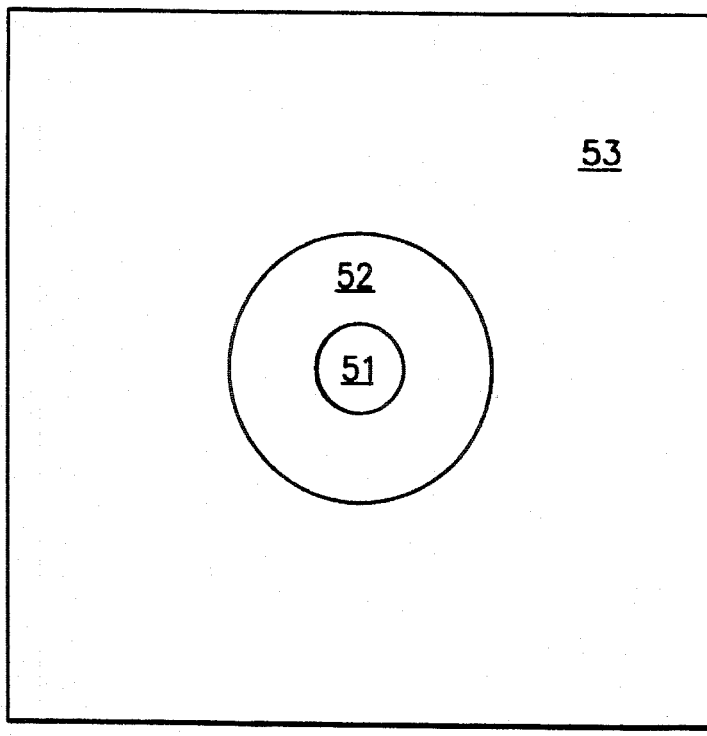
FIGS. 3 through 6 represent some of the possible configurations of the back focal plane filter, with and without features such as inner blocking, sector blocking and multiple scattering.

FIG. 3 represents a back focal plane filter 5 with a simple scattering annulus 52 surrounded by an outer blocking region 53.

Figure 4:
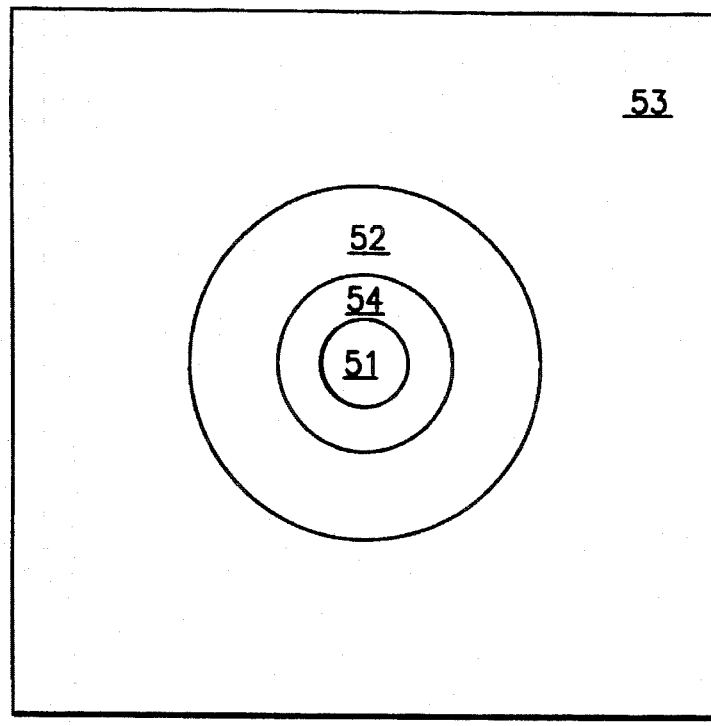

FIG. 4 represents a back focal plane filter 5 with an inner blocking ring 54 inside scattering annulus 52, and an outer blocking region 53. This will reduce the PS component significantly (by increasing PB a corresponding amount), thus increasing contrast (as per equation (9)). It also calls for a larger NS component (as per equation (8)), as indicated by the larger scattering annulus 52 in the figure.

Figure 5:
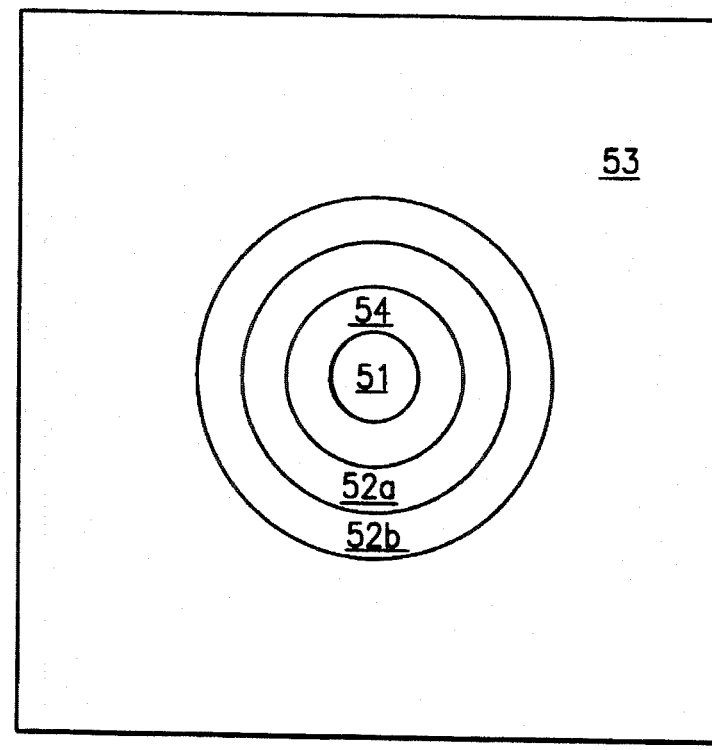

FIG. 5 represents a back focal plane filter 5 with an inner blocking ring 54, multiple scattering annuli 52*a* and 52*b*, and an outer region 53. This is essentially the same as FIG. 4, but illustrates the use of multiple degrees of scattering in combination to tailor the lateral distribution of the scattered energy.

Figure 6:
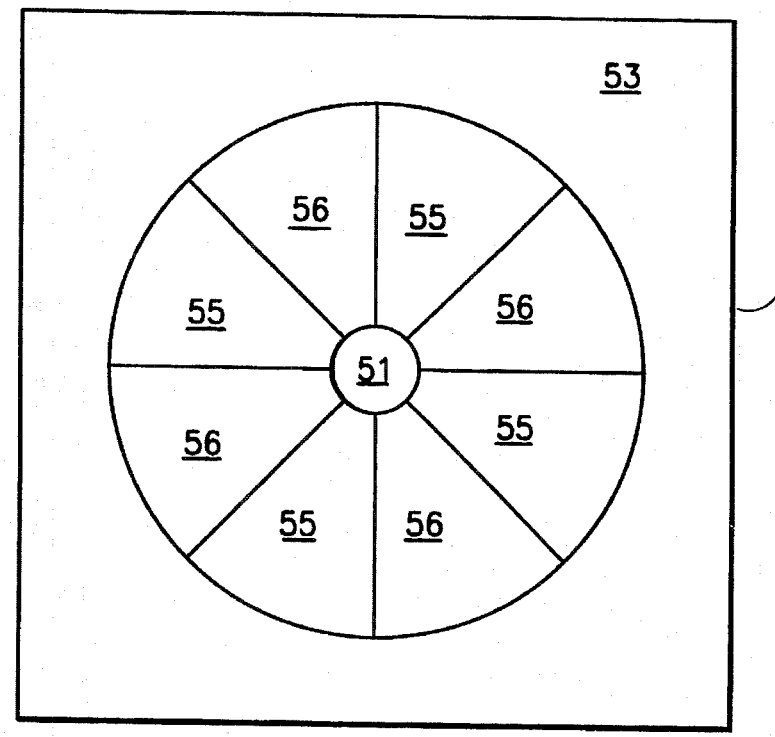

FIG. 6 represents a back focal plane filter 5 with long radial scattering sectors 55, spaced by opaque radial sectors 56, instead of a smaller circularly symmetric scattering annulus 52. This configuration is more tolerant of variations in the degree of scattering from one mask 3 to another, because the fraction of scattered energy passed is determined by sector width, not by radius of the annulus.

It should be understood that the foregoing description is only illustrative of the invention. For example, whereas the description and figures may implicitly or explicitly assume electron beam radiation and scattering of a circularly symmetric somewhat Gaussian nature, the radiation could be X-rays, ultraviolet light or any other part of the electromagnetic spectrum, and the scattering could be .less random in nature because of structure in the scattering materials of mask and filter. Various alternatives and modifications can be devised by those skilled in the art without departing from the invention. Accordingly the present invention is intended to embrace all such alternatives, modifications and variations which fall within the scope of the appended claims.

What is claimed is:

1. An improved lithographic projection method which comprises projecting radiation along a transmission path and through a lens system to produce a patterned image and an amount of undesired backscattered radiation on a target, said transmission path including:

a pattern-defining mask that contains two types of mask regions that produce different degrees of scattering in said radiation, and a back focal plane filter that contains at least three types of filter regions that produce different degrees of scattering or blocking of said radiation dependent on the degree of scattering produced by said mask, whereby the sum of the intensity distribution of said projected radiation which produces the patterned image on said target, combined with the intensity distribution of said undesired backscattered radiation resulting from the impact of said projected radiation at said target, produces a net effective exposure pattern at the target which is the sum of an idealized exposure reproducing the pattern of said mask and a background exposure substantially constant across said target.

2. A method as in claim 1 wherein said pattern-defining mask contains:

a first type of mask region that passes a first component of said projected radiation with relatively little scattering, and a second type of mask region that passes a second component of said projected radiation with significantly greater scattering, and wherein said back focal plane filter contains a first type of filter region that is relatively transparent to said projected radiation and is positioned and sized to pass a substantial fraction of said first component of said projected radiation but a far smaller fraction of said second component, and a second type of filter region that substantially blocks said projected radiation and is positioned and sized to block at least some of said second component of said projected radiation, and at least a third type of filter region that scatters said projected radiation to a desired degree and is positioned and sized to pass a desired fraction of said second component of said projected radiation but a far smaller fraction of said first component.

3. A method as in claim 2 wherein said back focal plane filter comprises a central aperture, being the only filter region of said first type, a scattering annulus around said central aperture, being the only filter region of said third type, and an opaque outer region encompassing all of said back focal plane filter beyond said scattering annulus, being the only filter region of said second type.

4. A method as in claim 2 wherein said back focal plane filter comprises:

a central aperture;

a blocking :Ping comprising a filter region of said second type, around said central aperture;

a scattering annulus around said blocking ring; and an opaque outer region.

5. A method as in claim 3 wherein said scattering annulus is interrupted by one or more opaque radial sectors.

6. A method as in claim 4 wherein said scattering annulus is interrupted by one or more opaque radial sectors.

7. A method as in claim 3 wherein said scattering annulus produces variable degrees of scattering through different areas thereof.

8. A method as in claim 4 wherein said scattering annulus produces variable degrees of scattering through different areas thereof.

9. A method as in claim 5 wherein said scattering annulus produces variable degrees of scattering through different areas thereof.

10. An improved lithographic projection apparatus for projecting radiation along a transmission path and through a lens system to produce a patterned image and an amount of undesired backscattered radiation on a target, said transmission path including:

a pattern-defining mask that contains two types of mask regions that produce different degrees of scattering in said radiation, and a back focal plane filter that contains at least three types of filter regions that produce different degrees of scattering or blocking of said radiation dependent on the degree of scattering produced by said mask, whereby the sum of the intensity distribution of said projected radiation which produces the patterned image on said target, combined with the intensity distribution of said undesired backscattered radiation resulting from the impact of said projected radiation at said target, produces a net effective exposure pattern at the target which is the sum of an idealized exposure reproducing the pattern of said mask and a background exposure substantially constant across said target.

11. An apparatus as in claim 10 wherein said pattern-defining mask contains:

a first type of mask region that passes a first component of said projected radiation with relatively little scattering, and a second type of mask region that passes a second component of said projected radiation with significantly greater scattering, and wherein said back focal plane filter contains a first type of filter region that is relatively transparent to said projected radiation and is positioned and sized to pass a substantial fraction of said first component of said projected radiation but a far smaller fraction of said second component, and a second type of filter region that substantially blocks said projected radiation and is positioned and sized to block at least some of said second component of said projected radiation, and at least a third type of filter region that scatters said projected radiation to a desired degree and is positioned and sized to pass a desired fraction of said second component of said projected radiation but a far smaller fraction of said first component.

12. An apparatus as in claim 11 wherein said back focal plane filter comprises a central aperture, being the only filter region of said first type, a scattering annulus around said central aperture, being the only filter region of said third type, and an opaque outer region encompassing all of said back focal plane filter beyond said scattering annulus, being the only filter region of said second type.

13. An apparatus as in claim 11 wherein said back focal plane filter comprises:

a central aperture;

a blocking ring comprising a filter region of said second type, around said central aperture;

a scattering annulus around said blocking ring; and an opaque outer region.

14. An apparatus as in claim 12 in which said scattering annulus is interrupted by one or more opaque radial sectors.

15. An apparatus as in claim 12 in which said scattering annulus produces variable degrees of scattering from different areas thereof.

* * * * *